United States Patent
Ahonen

[11] Patent Number: 5,507,010
[45] Date of Patent: Apr. 9, 1996

[54] ARRANGEMENT FOR MEASURING AT FREQUENCIES ACTUALLY USED FOR SIGNALLING, THE CONDITION OF A RECEIVING ANTENNA POSITIONED APART FROM OTHER BASE STATION EQUIPMENT AT A BASE STATION OF A RADIO SYSTEM

[75] Inventor: Jalo Ahonen, Oulu, Finland

[73] Assignee: Nokia Telecommunications OY, Espoo, Finland

[21] Appl. No.: 295,833

[22] PCT Filed: Dec. 29, 1993

[86] PCT No.: PCT/FI93/00563

§ 371 Date: Aug. 30, 1994

§ 102(e) Date: Aug. 30, 1994

[87] PCT Pub. No.: WO94/16335

PCT Pub. Date: Jul. 21, 1994

[30] Foreign Application Priority Data

Dec. 30, 1992 [FI] Finland .................................. 925952

[51] Int. Cl.⁶ .................................................. H04B 17/00
[52] U.S. Cl. ..................... 455/67.4; 455/226.1; 455/283; 455/289; 343/703; 324/645
[58] Field of Search .................. 455/56.1, 67.1, 455/67.4, 226.1, 226.2, 226.3, 226.4, 289, 280, 282, 283, 89, 115; 370/13, 17, 95.1, 95.3; 324/645; 343/703

[56] References Cited

U.S. PATENT DOCUMENTS

| | | | |
|---|---|---|---|
| 4,096,441 | 6/1978 | Schwartz | 343/703 |
| 4,754,496 | 6/1988 | Fishkin et al. | 343/703 |
| 4,962,359 | 10/1990 | Dunsmore | 324/646 |

FOREIGN PATENT DOCUMENTS

| | | | |
|---|---|---|---|
| 91 19363 | 12/1991 | WIPO . | |
| 9212582 | 7/1992 | WIPO | 455/67.5 |
| 92 03744 | 3/1993 | WIPO . | |

*Primary Examiner*—Andrew I. Faile
*Attorney, Agent, or Firm*—Cushman Darby & Cushman

[57] ABSTRACT

An arrangement for measuring the condition of a receiver antenna at a base station, utilizing an antenna amplifier positioned in connection with an antenna apart from other base station equipments, e.g., at a mast. A measuring signal is generated in connection with the other base station equipments at a frequency outside the frequency band used for radio traffic and applied through an antenna line to the antenna amplifier, in which the measuring signal is converted to the actual measuring frequency within the frequency band intended for the radio traffic.

10 Claims, 2 Drawing Sheets

ARRANGEMENT FOR MEASURING AT FREQUENCIES ACTUALLY USED FOR SIGNALLING, THE CONDITION OF A RECEIVING ANTENNA POSITIONED APART FROM OTHER BASE STATION EQUIPMENT AT A BASE STATION OF A RADIO SYSTEM

BACKGROUND OF THE INVENTION

The invention relates to an arrangement for measuring the condition of a receiver antenna at a base station of a system, the arrangement comprising a receiver antenna positioned apart from other base station equipments, e.g., at a mast; an amplifying means positioned in connection with the antenna for amplifying an antenna signal; a means for generating a radio frequency measuring signal; a first directional coupler means for applying the measuring signal to an antenna line towards the antenna between the amplifying means and the antenna; a second directional coupler means for applying the measuring signal to the antenna line towards the receiver between the amplifying means and the antenna; switching means for switching the radio frequency measuring signal from the generating means alternately to the first and the second directional coupler means; means for measuring the strength of a measuring signal component sent towards the antenna and reflected back from the antenna and the strength of the measuring signal sent directly towards the receiver.

A substantial part of radio systems, for instance cellular radio telephone systems and base stations thereof, are receiver and transmitter antennas, the condition of which influences the quality of connections. A control of the condition of the antennas can be carried out e.g., by measuring the SWR (Standing Wave Ratio) of the antennas, i.e., electrical matching of the antennas to the remaining part of the receiver and transmitter system.

By means of present methods, the measurement is performed by supplying power through the antenna line to the receiver antenna and by measuring the power reflected back from the antenna along the antenna line by means of a broadband power meter. Due to the broadband power meter, the power used for the measurement must be high in order that the measurement will not be sensitive to interference, which means that signals received by the antenna do not disturb the measurement. Using high power causes intermodulation distortion in the receiver. These problems can be avoided by using a duplex filter separating from each other the measuring signal and the signals intended to be received. However, the duplex filter must be installed before the receiver parts, which weakens the sensitivity of the receiver, because the filter causes losses in the antenna signal.

A further solution is known, avoiding both above-mentioned problems by using a measuring frequency outside the receiver band and a narrow-band power measurement adapted to this frequency.

European Patent Application 0 261 828 discloses an analyzer of microwave range, measuring a signal supplied directly from a measuring source as well as a signal reflected from the microwave network to be analyzed, for a vector-based relative power measurement. At measurement of reflected power, a sample signal taken of the output power of a measuring generator is brought to a detector along a path different from the path of a sample signal taken of the power reflected from the microwave network to be analyzed. Thus, the relative measurement of the reference cited would be somewhat insensitive to variations in the output level of the measuring generator, but since the signals to be compared with each other use different paths to the detector, the measurement does not automatically consider non-idealities or changes in the properties of components present on signal paths. The analyzer must be calibrated for the measurement of reflected power by measuring a known microwave standard at first with the analyzer and by using thus-obtained calibration values for later measurements. For measuring the condition of an antenna, this would mean that the power supply of the antenna should be connected to some microwave standard instead of the antenna for the calibration.

This problem has been solved in the Finnish Patent Application 904085 in such a way that, in addition to the signal reflected from the antenna, also the strength of the measuring signal sent directly towards the receiver is measured separately. By this second measurement is obtained a reference value for the strength of the measuring signal, which value considers at the measuring moment the transmission power of a measuring signal transmitter and the properties of the components present on the signal path, such as amplifiers and branching elements, and with which value the strength of a measuring signal component reflected from the antenna is compared. By a relative measurement of this kind, it is possible to eliminate the influence of the components present in the measuring circuit and on the measuring signal path between the properties of individual components, or the influence of temporal changes in the properties of an individual component on the accuracy of measurement. Manual checkings and calibrations during installation and operation can also be reduced and simplified substantially or they can even be entirely avoided. The measuring signal is preferably a narrow-band signal, the frequency of which is outside the frequency band allocated for traffic, due to which the measurement does not disturb the actual radio traffic, but, on the other hand, the measurement is not performed at actually used frequencies either, and for this reason, an actual standing wave ratio SWR will not be obtained.

New digital TDMA-type (TDMA=Time Division Multiple Access) radio systems have time-division signalling including several, typically 8, time slots at one frequency. One TDMA system is the pan-European mobile telephone system GSM. The GSM Specification 12.11, 3.1.0 B 05 "Receiver Antenna Fault" states requirements for the control of the condition of the antenna.

With the antenna positioned at the mast and provided with a mast preamplifier, the condition of the antenna cannot be measured in a normal way, because the preamplifier is located on the antenna line between the feed point of the measuring signal and the antenna and the measuring signal should pass through this preamplifier in reverse direction. An attenuation of the amplifier in reverse direction is typically 40 dB. The accuracy of measurement is influenced by attenuations of even a few decibels, such as a receiver filter, which is also positioned at the mast. There is thus a need of providing the mast with a switching point for the measuring signal between the mast preamplifier and the antenna.

SUMMARY OF THE INVENTION

The object of the invention is to implement a measurement of the condition of a receiver antenna provided with a mast preamplifier at a TDMA base station at actually used frequencies.

This is achieved by means of an arrangement of the type presented in the introduction, the arrangement being according to the invention characterized in that the measuring signal to be switched to the directional coupler means has a first frequency on a frequency band allocated for the radio traffic of the radio system, and that the generating means are positioned in connection with the other base station equipments and comprise means for sending the measuring signal through the antenna line to the switching means at a second frequency outside the frequency band allocated for the radio traffic of the radio system, and that the switching means comprise a means connected to the antenna line between the amplifying means and the other base station equipments for the reception of the measuring signal at the second frequency and mixer means for converting the measuring signal from the second frequency to the first frequency before the measuring signal is switched to the directional coupler means.

In the invention, the measuring signal is generated in connection with the other base station equipments and applied outside the frequency band used for the traffic through the antenna line to the preamplifier, in which the measuring signal is converted to the actual measuring frequency within the frequency band intended for the traffic.

In a preferred embodiment of the invention, the radio system is a TDMA system and the measurement is performed in a time slot allocated for a radio test loop, whereby frequencies actually used for the traffic can be utilized. In one embodiment of the invention, a radio frequency measuring signal is generated at transmission frequency in a transmitter and looped through the radio test loop at reception frequency to the receiver side, thereby avoiding a separate measuring signal generator. By means of the invention, the signal in its original form is obtained to a switching point at the mast without interfering the received signal from the antenna within the actual reception band.

BRIEF DESCRIPTION OF THE DRAWINGS

In the following, the invention will be explained in more detail by means of illustrative embodiments with reference to the attached drawing, in which.

DETAILED DESCRIPTION

The invention is suitable for being used especially in a full duplex-type transceiver of a base station of TDMA radio systems.

Figure 1:
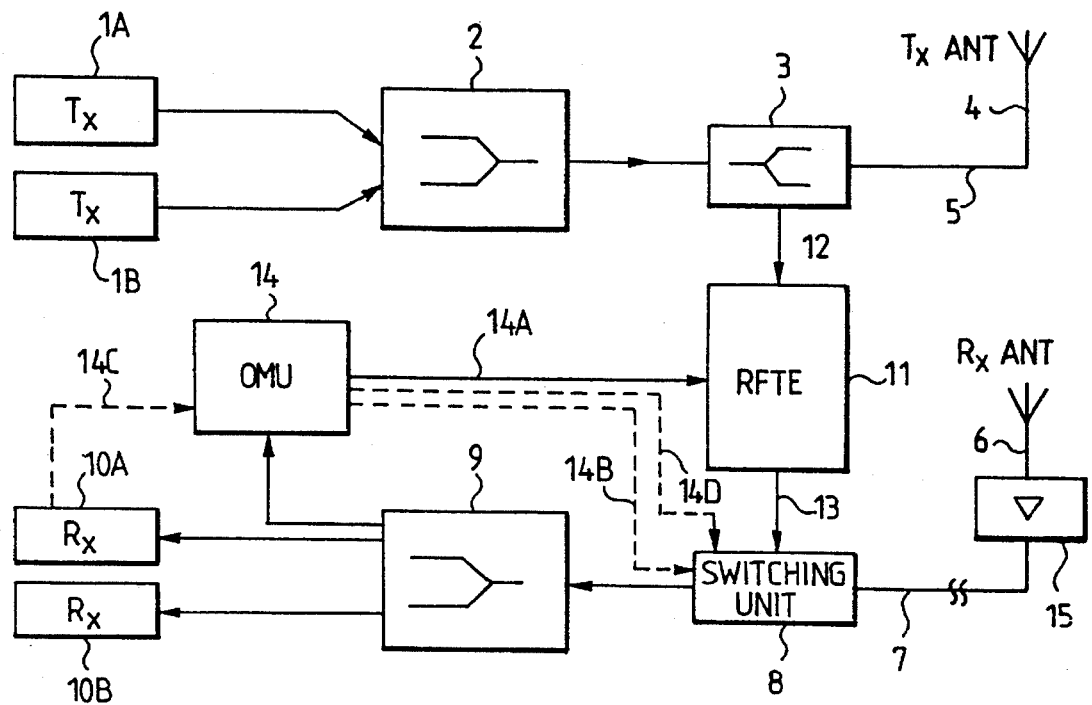
FIG. 1 shows a block diagram of receiver equipments of a base station according to the invention.

In FIG. 1, a TDMA transceiver comprises at least two, preferably 4, pairs of transceivers 1A, 10A and 1B, 10B, respectively, each pair constituting one full duplex connection. The outputs of the transmitter units 1A and 1B are connected by means of a combining element 2 (combiner) to a common antenna line 3 and to a common transmitter antenna 4. A receiver antenna 6 positioned apart from other base station equipments, e.g., at a mast, is connected via an associated preamplifier unit 15 (hereafter called a mast unit) and an antenna line 7 to a branching element 9, which divides the received signal to the receiver units 10A and 10B. In this connection, transmitter and receiver units primarily signify radio parts of a transceiver. Each transmitter and receiver unit has an individual transmission or reception frequency, whereby the transmission and reception frequencies of the units, such as 1A and 10A, constituting a full duplex pair, are at a distance of a duplex spacing, e.g., 45 MHz, from each other.

A receiver Rx receives from the antenna a TDMA signal, each frequency of which comprises several, typically 8, time slots. The signal has additionally a frame structure having e.g., eight successive time slots constituting a frame. Further, frames can form multiframes (e.g., 26 or 52 frames) and multiframes hyperframes. One TDMA system is the pan-European mobile telephone system GSM. Time slots are mainly used for transferring control and traffic channels.

Transceivers often use a radio test loop, in which a radio frequency test signal generated by the transmitter part is led in a correct manner back to the receiver part of the same transceiver for reception and analysis. Such a radio test loop of a transceiver is described e.g., in the Finnish Patent 85080 included herein as a reference.

In the GSM system, for instance, at least one time slot of a frame, multiframe or hyperframe is, however, allocated for an establishment of a radio test loop from the transmitter to the receiver.

A radio test unit 11 is connected between the antenna lines 5 and 7. For this purpose, the antenna line 5 comprises a branching element 3, which branches-off a portion of a transmission RF signal to an input 12 of the radio test unit 11. The radio test unit 11 converts the transmission frequency signal into a reception RF signal. An output 13 of the radio test unit 11 is connected to the antenna line 7 by means of a switching unit 8, hereafter called a ground unit. The radio test loop is normally intended for testing the RF parts of the base station, except the receiver antenna and the receiver antenna cable.

In a preferred embodiment of the invention, the condition of the receiver antenna 6 is measured in a time slot allocated for the radio test loop. In the embodiment of FIG. 1, a radio test signal looped during a radio test time slot from the transmitter part to the receiver antenna line is used as a measuring signal and sent on a radio channel (at a frequency) used for normal traffic of the radio system.

Figure 2:
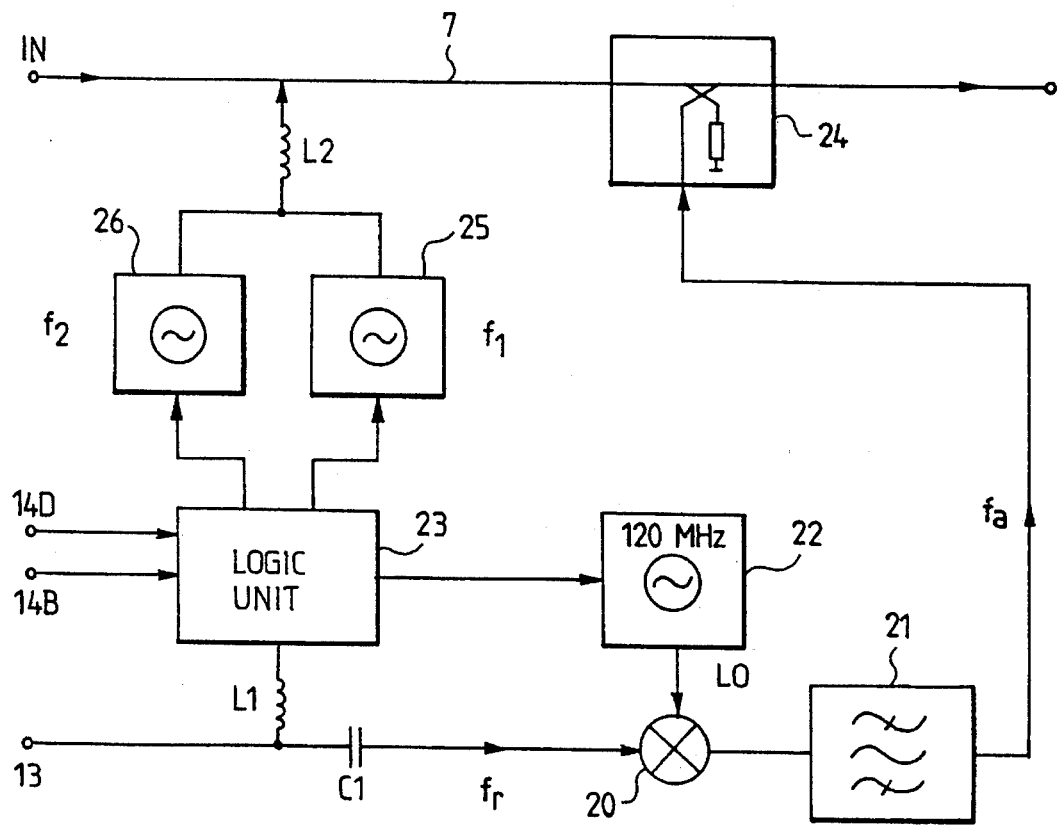
FIG. 2 shows a block diagram of a ground unit 8 of FIG. 1.

FIG. 2 shows the sub-unit 8 of FIG. 1 in greater detail. A measuring signal at reception frequency fr obtained from the radio test unit 11 via coupling condenser C is mixed in a mixer 20 to a frequency fa outside the reception band by means of a local oscillator signal LO obtained from a local oscillator 22. For instance, when the signal 13 has a frequency of 890 to 915 MHz and the signal LO a frequency of 120 MHz, the measuring signal can be converted to a frequency higher or lower than 120 MHz, e.g., to a range of 770 to 795 MHz. The upper harmonic of the mixing result is filtered off by a passband filter 21 and the down-converted measuring signal is switched by a directional coupler 24 to the antenna cable 7 towards the antenna 7. Correspondingly, oscillators 25 and 26 generate control signals having frequencies f1 and f2. The control signals are connected to the antenna cable 7 by a coil L2. A logic unit 23 controls the operation of the oscillators 22, 25 and 26, switching them on and off according to the control of line 14 B from the maintenance unit (OMU) 14 and the DC level obtained on line 13 and via coil L1 from the test unit 11. When the oscillator 22 is switched on, the oscillator 26 is also in operation and the frequency f2 is transmitted. When the oscillator 22 is switched off, the frequency f2 is not transmitted either. As will be described later in more detail, this arrangement makes it possible that both an oscillator 39 of the mast unit 15 and the oscillator 22 of the ground unit 8 are switched on only during the measurement of the antenna.

Possible interferences caused by the oscillators in conventional radio traffic are thus prevented. The ground unit 8 obtains an information of the moment when the antenna is measured from the OMU 14 via line 14B. On the other hand, the DC level of the signal 13 indicates the switching direction of the measuring signal, i.e. towards the receiver or the antenna. This information of direction is converted into the frequency f1. When f1 is transmitted, the switching direction is towards the antenna. When f1 is lacking, the switching direction is towards the receiver.

Figure 3:
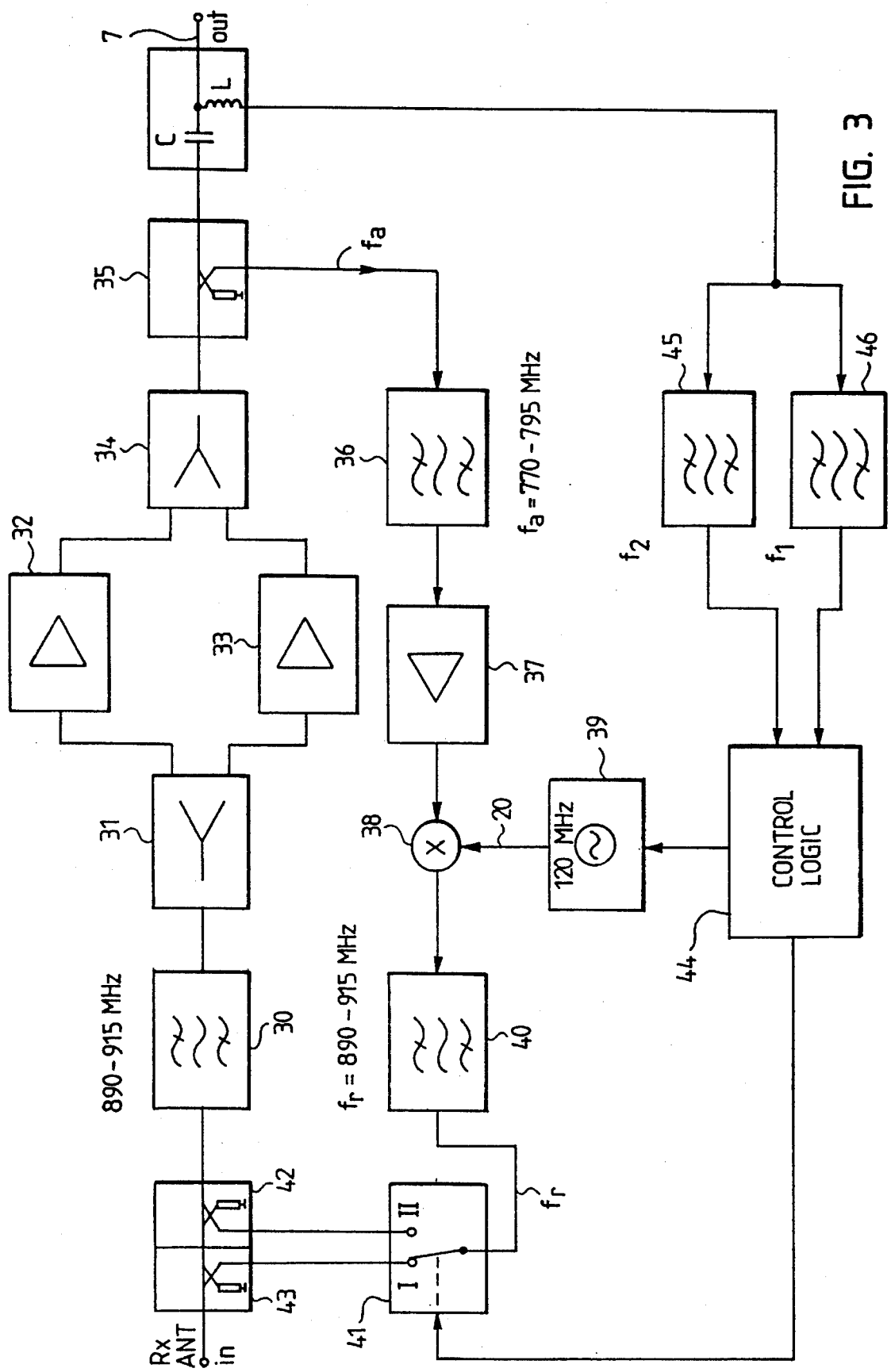
FIG. 3 shows a block diagram of a mast unit 15 of FIG. 1.

The mast unit 15 in connection with the antenna preamplifier of the mast is illustrated in more detail in FIG. 3. The unit 15 comprises conventionally a receiver filter 30 and an amplifier unit secured on hot stand-by principle, consisting of a branching element 31, parallel amplifier branches 32 and 33 and a combining element 34. The actual measuring equipment comprises a directional coupler 35, which takes from the antenna cable 7 a measuring signal sent by the ground unit 8 at the frequency fa, the other frequencies, such as the actual reception frequencies, around the frequency fa being filtered off by means of a passband filter 36 (band width e.g., 770 to 795 MHz). The filtered measuring signal is amplified by an amplifier 37 and then converted in a mixer 38 back to the reception frequency fr by the local oscillator signal LO obtained from the oscillator 39. The signal LO has the same frequency as the signal LO of the ground unit 8. Frequencies outside the receiver band are eliminated from the mixing result by means of a passband filter 40 and the filtered signal is brought to a switch S4. A switch 41 switches the measuring signal selectively and alternatingly to directional couplers 42 and 43 connecting the measuring signal to the antenna cable 7 between the mast unit 15 and the antenna 6. The directional coupler 42 supplies the measuring signal towards the preamplifier and the receiver and the directional coupler 43 towards the antenna 6. In this manner, a measuring signal identical with the original signal 13 can be switched to the antenna line 7 between the antenna 6 and the unit 15 before the receiver filter 30 without interferring the actual receiver signal going in another direction.

The switch 41 and the oscillator 39 are controlled by a control logic 44 according to control signals f1 and f2 received from the antenna line. The control signals are separated from the antenna cable 7 coming from ground unit 8 by the coil L and filtered by means of passband filters 45 and 46. The filtered control signals are detected in the control logic 44. Upon detecting the frequency f1, the control logic 44 controls the switch 41 to position I, in which the measuring signal is switched to the directional coupler 43. If frequency f1 does not occur, the control logic 44 controls the switch 41 to position II, in which the measuring signal is switched to the directional coupler 42. Upon detecting the frequency f2, the control logic 44 switches on the oscillator 39. When frequency f2 does not occur, the control logic 44 switches off the oscillator 39. By means of this arrangement, the oscillator 39 of the mast unit 15 as well as the oscillator 22 of the ground unit 8 are switched on only during the measurement of the antenna. Possible interferences caused by the oscillators in normal radio traffic are thus prevented. The ground unit 8 receives an information of the moment when the antenna is measured from the OMU 14 through line 14B.

The measurement takes place at normal reception frequencies of the radio system during normal operation of the receiver Rx. Test operations are controlled by the operation and maintenance unit 14 of the base station, which unit commands the test unit 11 through control line 14A to form a test loop within a predetermined time slot and informs whether the measuring signal is switched towards the antenna or towards the receiver. In the preferred embodiment of the invention, the test unit 11 then controls the ground unit 8 by the DC level of the output 13. Direction control can also be given directly from the OMU 14 to the sub-unit 8 through control line 14D. Outside the test time slot, the measuring signal is disconnected from the output 13 by means of a decoupling switch within the unit 11.

Moreover, the OMU 14 acts as a measuring unit, which receives a signal from the branching element 9 and measures the strength of the signal. Alternatively, the receivers Rx may contain a measuring equipment, the measuring result of which is received by the OMU 14 through line 14C.

The measuring procedure is as follows. The quantity to be measured is the standing wave ratio SWR of the antenna.

1) The OMU 14 gives the test unit 11 a normal radio test loop command, in consequence of which a measuring signal is looped in a test time slot to the ground unit 8. The OMU 14 also informs the ground unit 8 of the antenna measuring transaction, due to which the oscillator 22 starts and the measuring signal is converted to the frequency fa and transmitted to an upper unit 15, in which it is reconverted to the frequency fr and switched, depending on the direction information, e.g. to the directional coupler 42, i.e. directly towards the receiver. The OMU 14 measures the strength of the measuring signal and uses an RSSI value of the strength of the received signal, formed from the measurement result, as a reference value REFSIGN.

2) The OMU 14 gives the test unit 11 a new radio test loop command to direct the measuring signal towards the antenna 6, however. The switch 41 switches the measuring signal to the directional coupler 43. The OMU 14 measures the strength of a signal component reflected from the antenna 6 and uses the RSSI value formed from the measurement result as a measured value ANTSIGN.

3) The OMU 14 calculates the SWR of the antenna from these two values ANTSIGN and REFSIGN.

4) The OMU 14 compares the calculated SWR value with stored alarm limits. If the calculated value is higher/lower than the alarm limits, the alarm is given. The data base of the OMU 14 contains a calibrated SWR or SRRI value for each used frequency, preferably also for each antenna sector and both for a normal antenna and a diversity antenna e. During the setup of the base station or when the antenna or the antenna cable is changed, the measurements 1, 2 and 3 of each frequency, sector and antenna are gone through and the SWR values obtained as a result are stored as calibrated values in the data base of the OMU.

The drawing figures and the description provided above are only intended to illustrate the present invention. As to the details, the arrangement according to the present invention may vary within the scope of the appended claims.

I claim:

1. An arrangement for measuring the condition of a receiver antenna at a base station of a radio system, comprising:

said receiver antenna being positioned remote from other base station equipments;

an amplifying means positioned in connection with said antenna for amplifying an antenna signal;

a means for generating a radio frequency measuring signal;

a first directional coupler means for applying said measuring signal to an antenna line towards said antenna between said amplifying means and said antenna;

a second directional coupler means for applying the measuring signal to said antenna line towards said receiver between said amplifying means and said antenna;

switching means for switching the radio frequency measuring signal from said generating means alternately to said first and second directional coupler means;

means for measuring the strength of a measuring signal component sent towards said antenna and reflected back from said antenna and the strength of the measuring signal sent directly towards said receiver;

the measuring signal to be switched to the directional coupler means having a first frequency on a frequency band allocated for radio traffic of said radio system;

said generating means being positioned in connection with said other base station equipments and comprising means for sending the measuring signal through said antenna line to said switching means at a second frequency outside said frequency band allocated for radio traffic of said radio system;

said switching means comprising a means connected to said antenna line between said amplifying means and said other base station equipments for the reception of said measuring signal at said second frequency and mixer means for converting said measuring signal from said second frequency to said first frequency before said measuring signal is switched to one of said first and second directional coupler means.

2. An arrangement according to claim 1, wherein:

said radio system is a TDMA system; and transmission of a measuring signal at the first frequency is permitted only in a TDMA time slot of said base station intended for an establishment of a radio test loop.

3. An arrangement according to claim 1, wherein:

said generating means comprise a radio test loop for looping said measuring signal from a transmitter of said base station at said first frequency.

4. An arrangement according to claim 1, wherein:

said generating means comprise a measuring signal generator for generating said measuring signal at said first frequency.

5. An arrangement according to claim 1, wherein:

said generating means comprise mixer means for converting said measuring signal from said first frequency to said second frequency before said measuring signal is sent through said antenna line to said switching means.

6. An arrangement according to claim 1, wherein:

said generating means comprise means for sending switching state information through said antenna line to said switching means; and said switching means is responsive to said switching state information for switching said measuring signal selectively to said first and second directional coupler means.

7. An arrangement according to claim 6, wherein:

said means for sending switching information comprise generator means for generating a control signal at a third frequency, when said measuring signal is switched to said first directional coupler means.

8. An arrangement according to claim 7, wherein:

said switching means comprise a change-over switch means, detector means for detection of said control signal, and control means responsive to said detector means for bringing said change-over switch means to a first position, in which said measuring signal is switched to said first directional coupler means when said detector means detect said control signal at said third frequency, and to a second position, in which said measuring signal is switched to said second directional coupler means when said detector means does not detect said control signal at said third frequency.

9. An arrangement according to claim 1, wherein:

said generating means comprise means for sending operating state information through said antenna line to said switching means; and said switching means are responsive to said operating state information for switching on and off a local oscillator of said mixer means.

10. An arrangement according to claim 1, wherein:

said base station includes a mast; and said receiving antenna is positioned on said mast.

* * * * *